United States Patent
Morita et al.

(10) Patent No.: US 8,211,619 B2
(45) Date of Patent: Jul. 3, 2012

(54) POSITIVE PHOTOSENSITIVE COMPOSITION, POSITIVE PERMANENT RESIST, AND METHOD FOR PRODUCING POSITIVE PERMANENT RESIST

(75) Inventors: Hiroshi Morita, Tokyo (JP); Hiromi Sato, Tokyo (JP); Atsushi Kobayashi, Tokyo (JP); Jinichi Omi, Tokyo (JP); Seiichi Saito, Tokyo (JP)

(73) Assignee: Adeka Corporation, Tokyo (JP)

( * ) Notice: Subject to any disclaimer, the term of this patent is extended or adjusted under 35 U.S.C. 154(b) by 201 days.

(21) Appl. No.: 12/742,557

(22) PCT Filed: Nov. 12, 2008

(86) PCT No.: PCT/JP2008/070553
§ 371 (c)(1),
(2), (4) Date: May 12, 2010

(87) PCT Pub. No.: WO2009/063887
PCT Pub. Date: May 22, 2009

(65) Prior Publication Data
US 2010/0273104 A1    Oct. 28, 2010

(30) Foreign Application Priority Data
Nov. 13, 2007   (JP) ................................ 2007-294503

(51) Int. Cl.
G03F 7/075 (2006.01)
G03F 7/16 (2006.01)
G03F 7/20 (2006.01)
G03F 7/30 (2006.01)
G03F 7/40 (2006.01)

(52) U.S. Cl. .................. 430/270.1; 430/271.1; 430/311; 430/326; 430/327; 430/328; 430/330; 430/331; 430/914; 430/919; 430/923

(58) Field of Classification Search .................. None
See application file for complete search history.

(56) References Cited

U.S. PATENT DOCUMENTS
4,722,881 A    2/1988   Ueno et al.
2006/0115766 A1    6/2006   Suwa et al.

FOREIGN PATENT DOCUMENTS
JP   61-144639 A   7/1986
JP   2006-178436 A   7/2006
JP   2006-276598 A   10/2006
JP   2007-41361 A   2/2007
JP   2007-122029 A   5/2007
JP   2010-101957    5/2010

OTHER PUBLICATIONS
Japanese Office Action issued in Japanese Patent Application No. 2009-541143 on Mar. 23, 2012.

Primary Examiner — Sin J. Lee
(74) Attorney, Agent, or Firm — Birch, Stewart, Kolasch & Birch, LLP.

(57) ABSTRACT

The present invention provides: a positive photosensitive composition that yields an insulation layer superior not only in high transparency, but also in heat resistance enduring a temperature during the production of a substrate, solvent resistance, and anti-aging property as a permanent resist; a positive permanent resist utilizing the positive photosensitive composition; and a method for producing the positive permanent resist. The present invention provides: a positive photosensitive composition containing (A) a curable silicone resin having a silanol group, which resin has a structure obtained by a reaction between one or more cyclic siloxane compounds represented by the following general formula (1):

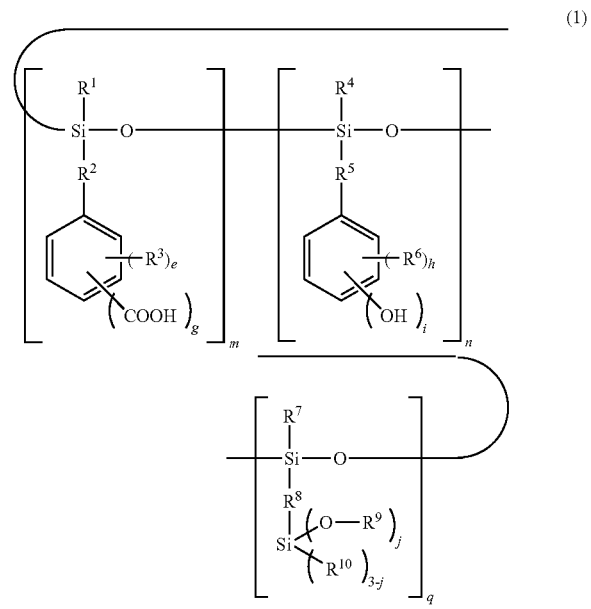

and one or more arylalkoxysilane compounds represented by the following general formula (2):

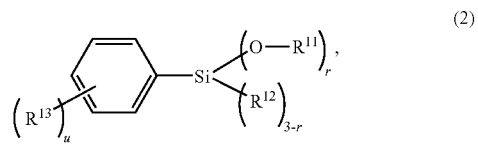

(B) diazonaphthoquinones, and (C) a solvent; a positive permanent resist using the positive photosensitive composition; and a method for producing the positive permanent resist.

3 Claims, No Drawings

POSITIVE PHOTOSENSITIVE COMPOSITION, POSITIVE PERMANENT RESIST, AND METHOD FOR PRODUCING POSITIVE PERMANENT RESIST

TECHNICAL FIELD

The present invention relates to a positive photosensitive composition using a curable silicone resin having a silanol group, a positive permanent resist using the positive photosensitive composition, and a method for producing the positive permanent resist.

BACKGROUND ART

A permanent resist utilizing a positive photosensitive composition that allows patterning by light irradiation has been used. There is still a need for a positive photosensitive composition that can be used especially as an insulation layer on a TFT substrate for a liquid crystal display, an organic EL display and the like, offering not only high transparency, but also heat resistance enduring a temperature during the production of the substrate, and solvent resistance, as well as excellent anti-aging property as a permanent resist.

Concerning such positive photosensitive compositions, for example, (a) a siloxane polymer, (b) a quinonediazide compound, and (c) a positive photosensitive siloxane composition containing a solvent have been disclosed, as in the following Patent Documents 1 to 4.

Patent Document 1: Japanese Unexamined Patent Application Publication No. 2006-178436
Patent Document 2: Japanese Unexamined Patent Application Publication No. 2006-276598
Patent Document 3: Japanese Unexamined Patent Application Publication No. 2007-41361
Patent Document 4: Japanese Unexamined Patent Application Publication No. 2007-122029

DISCLOSURE OF THE INVENTION

Problems to be Solved by the Invention

The positive photosensitive siloxane compositions described in the Patent Documents 1 to 4 have improved properties of high heat resistance, high transparency and low permittivity to certain extent; however, not yet sufficient.

In view of this, an object of the present invention is to provide: a positive photosensitive composition that yields an insulation layer superior not only in high transparency, but also in heat resistance enduring a temperature during the production of a substrate, solvent resistance, and anti-aging property as a permanent resist; a positive permanent resist utilizing the positive photosensitive composition; and a method for producing the positive permanent resist.

Means for Solving the Problems

Intensive research was accumulated by the present inventors to achieve the above-mentioned object. As a result, the present invention has been accomplished by finding that a positive photosensitive composition containing a curable silicone resin having a certain silanol group, a diazonaphthoquinones and a solvent exhibits not only high transparency, but also superior heat resistance enduring a temperature during the production of a substrate and solvent resistance.

Namely, a positive photosensitive composition according to the present invention comprises:

(A) a curable silicone resin having a silanol group, the resin being obtained by a reaction between a cyclic siloxane compound represented by the following general formula (1):

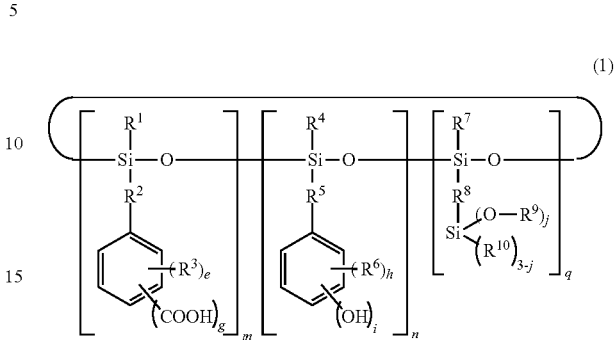

(1)

(wherein $R^1$, $R^4$ and $R^7$ are $C_1$ to $C_{10}$ alkyl groups, cycloalkyl groups or aryl groups that may be the same or different; $R^2$, $R^5$ and $R^8$ are $C_1$ to $C_{10}$ alkylene groups that may be the same or different and be substituted by a hydrocarbon group; $R^3$ and $R^6$ are $C_1$ to $C_4$ alkyl groups that may be the same or different; e is a number of 0 or 1 to 4 and g is a number of 1 to 3, provided that e+g does not exceed 5; h is a number of 0 or 1 to 4 and i is a number of 1 to 3, provided that h+i does not exceed 5; $R^9$ is a $C_1$ to $C_6$ alkyl group or cycloalkyl group that may be the same or different; $R^{10}$ is a $C_1$ to $C_3$ alkyl group; j is a number of 1 to 3; and m, n and q are numbers satisfying m:n:q=1:0 to 2:0.5 to 3 as well as m+n+q=3 to 6)

and an arylalkoxysilane compound represented by the following general formula (2):

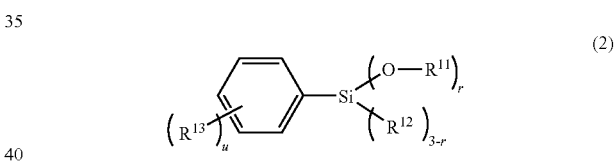

(2)

(wherein $R^{11}$ is a $C_1$ to $C_6$ alkyl group or cycloalkyl group that may be the same or different; $R^{12}$ is a $C_1$ to $C_3$ alkyl group; $R^{13}$ is a $C_1$ to $C_4$ alkyl group that may be the same or different; r is a number of 1 to 3; and u is a number of 0 or 1 to 5)

(B) a diazonaphthoquinones; and
(C) a solvent.

Further, the positive permanent resist according to the present invention is prepared by coating the positive photosensitive composition onto an object material.

Furthermore, a method for producing the positive permanent resist according to the present invention comprises the steps of: coating the positive photosensitive composition onto an object material; subjecting the object material to a temperature between 60 and 120° C. for 30 sec to 10 min; irradiating the heat-treated object material with patterned light to increase the alkali-solubility of the irradiated part; patterning by treating the irradiated object material with an alkali solution; irradiating the entire object material after the patterning to enhance the visible light transmission; and subjecting the object material irradiated entirely to a temperature between 120 and 350° C. for 30 min to 2 hours.

Advantages of the Invention

The present invention can provide a positive photosensitive composition that yields an insulation layer superior not only in high transparency, but also in heat resistance enduring a temperature during the production of a substrate, solvent resistance, and anti-aging property as a permanent resist; a positive permanent resist utilizing the positive photosensitive composition; and a method for producing the positive permanent resist.

BEST MODE FOR CARRYING OUT THE INVENTION (A) a curable silicone resin having a silanol group used in the present invention has a structure yielded by a reaction between a cyclic siloxane compound represented by the following general formula (1) and an arylalkoxysilane compound represented by the following general formula (2).

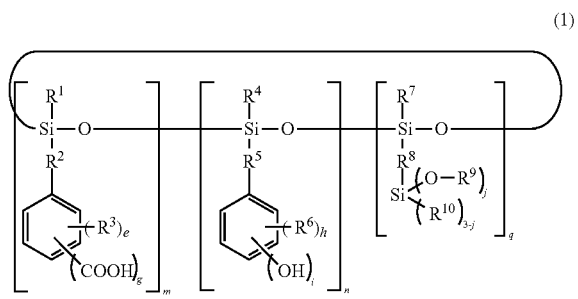

(wherein $R^1$, $R^4$ and $R^7$ are $C_1$ to $C_{10}$ alkyl groups, cycloalkyl groups or aryl groups that may be the same or different; $R^2$, $R^5$ and $R^8$ are $C_1$ to $C_{10}$ alkylene groups that may be the same or different and be substituted by a hydrocarbon group; $R^3$ and $R^6$ are $C_1$ to $C_4$ alkyl groups that may be the same or different; e is a number of 0 or 1 to 4 and g is a number of 1 to 3, provided that e+g does not exceed 5; h is a number of 0 or 1 to 4 and i is a number of 1 to 3, provided that h+i does not exceed 5; $R^9$ is a $C_1$ to $C_6$ alkyl group or cycloalkyl group that may be the same or different; $R^{10}$ is a $C_1$ to $C_3$ alkyl group; j is a number of 1 to 3; and m, n and q are numbers satisfying m:n:q=1:0 to 2:0.5 to 3 as well as m+n+q=3 to 6.)

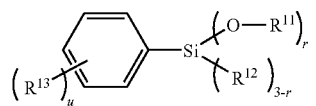

(wherein $R^{11}$ is a $C_1$ to $C_6$ alkyl group or cycloalkyl group that may be the same or different; $R^{12}$ is a $C_1$ to $C_3$ alkyl group; $R^{13}$ is a $C_1$ to $C_4$ alkyl group that may be the same or different; r is a number of 1 to 3; and u is a number of 0 or 1 to 5.)

There is no particular restriction on a cyclic siloxane compound represented by the general formula (1), insofar as it is represented by the general formula (1). Examples of the $C_1$ to $C_{10}$ alkyl group represented by $R^1$, $R^4$ and $R^7$ in the general formula (1) include linear primary alkyl groups consisting of a methyl group, an ethyl group, a propyl group, a butyl group, a pentyl group, a hexyl group, a heptyl group, an octyl group, a nonyl group and a decyl group; linear secondary alkyl groups consisting of an isopropyl group, a sec-butyl group, a sec-pentyl group, a sec-hexyl group, a sec-heptyl group, a sec-octyl group, a sec-nonyl group and a sec-decyl group; branched alkyl groups, such as an isobutyl group, a t-butyl group, an isopentyl group, a t-pentyl group, an isohexyl group, a t-hexyl group, a 2-methylpentyl group, an isoheptyl group, a t-heptyl group, an isooctyl group, a t-octyl group, a 2-ethylhexyl group, an isononyl group, a t-nonyl group, an isodecyl group, a t-decyl group and a 2-propylheptyl group. Examples of the $C_1$ to $C_{10}$ cycloalkyl group include a cyclopentyl group, a cyclohexyl group, a cycloheptyl group, a methylcyclopentyl group, a methylcyclohexyl group and a cyclohexylmethyl group; and examples of the $C_1$ to $C_{10}$ aryl group include a phenyl group, an ethylphenyl group, a toluoyl group, a cumenyl group, a xylyl group, a pseudocumenyl group, a mesityl group, a t-butylphenyl group, a benzyl group and a phenethyl group.

In view of industrial availability, for $R^1$, $R^4$ and $R^7$, preferable are a methyl group, an ethyl group, a propyl group, an isopropyl group, a butyl group, an isobutyl group, a t-butyl group and a phenyl group; more preferable are a methyl group, an ethyl group and a phenyl group; and most preferable is a methyl group.

Further, examples of a $C_1$ to $C_{10}$ alkylene group represented by $R^2$, $R^5$ and $R^8$ include a methylene group, an ethylene group, a propylene group, a butylene group, a pentene group, a hexene group, a heptene group, an octene group, a nonene group and a decene group, and although in view of the heat resistance, those having a lower carbon number are preferable, in view of industrial availability, preferable are an ethylene group, a propylene group and a butylene group, more preferable are an ethylene group and a butylene group, and most preferable is an ethylene group.

Further, examples of a substituting hydrocarbon group that may exist in $R^2$, $R^5$ and $R^8$ include a methyl group, an ethyl group, a propyl group, an isopropyl group, a butyl group, an isobutyl group, a t-butyl group and a phenyl group; but in view of the heat resistance such substituting group preferably does not exist.

Examples of the $C_1$ to $C_4$ alkyl group represented by $R^3$ and $R^6$ include a methyl group, an ethyl group, a propyl group, an isopropyl group, a butyl group, an isobutyl group, a sec-butyl group and a t-butyl group; and in view of the heat resistance, a $C_1$ to $C_3$ alkyl group is preferable, a methyl group and an ethyl group are more preferable, and a methyl group is most preferable.

In the general formula (1), e is 0 or 1 to 4, g is 1 to 3, and e+g does not exceed 5. In view of the heat resistance, e is preferably 0 or 1, and more preferably 0. In view of industrial availability, g is preferably 1 or 2, and more preferably 1. Although there is no particular restriction on the position of the carboxyl group (s) in the general formula (1), one of the carboxyl groups preferably takes the para position to $R^2$ in view of better heat resistance.

Further, h is preferably 0 or 1 in view of the heat resistance, and more preferably 0. In view of industrial availability, i is preferably 1 or 2, and more preferably 1. Although there is no particular restriction on the position of the hydroxy group (s) in the general formula (1), one of the hydroxy groups preferably takes the para position to $R^2$ in view of better heat resistance.

Examples of the $C_1$ to $C_6$ alkyl group or cycloalkyl group represented by $R^9$ in the general formula (1) include $C_1$ to $C_6$ alkyl groups or cycloalkyl groups out of the groups exemplified for $R^1$, $R^4$ and $R^7$, and in view of high reactivity, preferable are a methyl group, an ethyl group, a propyl group, an isopropyl group, a butyl group, an isobutyl group and a t-butyl group, more preferable are a methyl group, an ethyl group and an isopropyl group, and most preferable is a methyl group. In view of better heat resistance, j is preferably 2 to 3, and more preferably 3. $R^{10}$ is preferably a methyl group in view of better heat resistance.

As for the cyclic siloxane compound represented by the general formula (1), a type thereof may be used singly or 2 types or more thereof may be used in combination. If 2 types or more are used in combination, the values of m, n and q are an averaged value of the values of m, n and q of the respective compounds according to the contents of the respective compounds. For example, for an equimolar mixture of a compound with m=1, n=0 and q=3 and a compound with m=1, n=1 and q=2, the ratio of m:n:q can be expressed as 1:0.5:2.5. The ratio of n to m is preferably 0 to 1, more preferably 0.01 to 0.7, and most preferably 0.02 to 0.5.

The cyclic siloxane compound represented by the general formula (1) can be obtained by a hydrosilylation reaction of a cyclic siloxane compound represented by the following general formula (3):

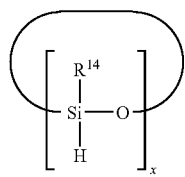

(wherein $R^{14}$ is a $C_1$ to $C_{10}$ alkyl group that may be the same or different, and x is a number of 3 to 6)
with an aromatic carboxylic acid compound represented by the following general formula (4):

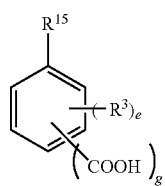

(wherein $R^{15}$ represents a group that reacts with Si—H to form $R^2$, and $R^2$, $R^3$, e and g are the same meanings as defined for the above formula (1));
a phenolic compound represented by the following general formula (5):

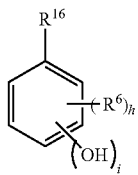

(wherein $R^{16}$ represents a group that reacts with Si—H to form $R^5$, and $R^5$, $R^6$, h and i are the same meanings as defined for the above formula (1)); or
an alkoxysilane compound represented by the following general formula (6):

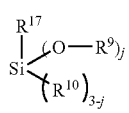

(wherein $R^{17}$ represents a group that reacts with Si—H to form $R^8$, and $R^8$, $R^9$, $R^{10}$ and j are the same meanings as defined for the above formula (1)).

Specific preferable examples of the cyclic siloxane compound represented by the general formula (3) include 2,4,6,8-tetramethylcyclotetrasiloxane (also called 1,3,5,7-tetramethylcyclotetrasiloxane), 2,4,6,8-tetraethylcyclotetrasiloxane, 2,4,6,8,10-pentamethylcyclopentasiloxane and 2,4,6,8,10,12-hexamethylcyclohexasiloxane, more preferable are 2,4,6,8-tetramethylcyclotetrasiloxane and 2,4,6,8,10-pentamethylcyclopentasiloxane, and most preferable is 2,4,6,8-tetramethylcyclotetrasiloxane.

Specific preferable examples of the aromatic carboxylic acid compound represented by the general formula (4) include 2-vinylbenzoic acid, 3-vinylbenzoic acid, 4-vinylbenzoic acid, 4-(1-phenylvinyl)benzoic acid, 2-methyl-4-vinylbenzoic acid, 2-allylbenzoic acid, 3-allylbenzoic acid, 4-allylbenzoic acid, 2-isopropenylbenzoic acid, 3-isopropenylbenzoic acid, 4-isopropenylbenzoic acid, 4-(3-butenyl)benzoic acid, 4-(4-pentenyl)benzoic acid, 4-(5-hexenyl)benzoic acid, 4-(6-heptenyl)benzoic acid, 4-(7-octenyl)benzoic acid, 4-(8-nonenyl)benzoic acid, 4-(9-decenyl)benzoic acid, 2-vinyl-1,4-benzenedicarboxylic acid and 5-vinyl-1,3-benzenedicarboxylic acid. From the viewpoints of industrial availability and the heat resistance of the permanent resist according to the present invention, preferable are 2-vinylbenzoic acid, 3-vinylbenzoic acid, 4-vinylbenzoic acid, 2-allylbenzoic acid, 4-allylbenzoic acid, 2-isopropenylbenzoic acid and 4-isopropenylbenzoic acid, more preferable are 2-vinylbenzoic acid and 4-vinylbenzoic acid, and most preferable is 4-vinylbenzoic acid. As for the aromatic carboxylic acid represented by the general formula (4), a type thereof may be used singly or 2 types or more thereof may be also used.

Specific preferable examples of the phenolic compound represented by the general formula (5) include 2-vinylphenol, 3-vinylphenol, 4-vinylphenol, 4-(1-phenylvinyl)phenol, 2-methyl-4-vinylphenol, 2-allylphenol, 3-allylphenol, 4-allylphenol, 2-isopropenylphenol, 3-isopropenylphenol, 4-isopropenylphenol, 4-(3-butenyl)phenol, 4-(4-pentenyl)phenol, 4-(5-hexenyl)phenol, 4-(6-heptenyl)phenol, 4-(7-octenyl)phenol, 4-(8-nonenyl)phenol, 4-(9-decenyl)phenol, 2-vinyl-1,4-dihydroxybenzene and 5-vinyl-1,3-dihydroxybenzene. From the viewpoints of industrial availability and the heat resistance of the permanent resist according to the present invention, preferable are 2-vinylphenol, 3-vinylphenol, 4-vinylphenol, 2-allylphenol, 4-allylphenol, 2-isopropenylphenol and 4-isopropenylphenol, more preferable are 2-vinylphenol and 4-vinylphenol, and most preferable is 4-vinylphenol. As for the phenolic compound represented by the general formula (5), a type thereof may be used singly or 2 types or more thereof may be also used.

Specific preferable examples of the alkoxysilane compound represented by the general formula (6) include trimethoxyvinylsilane, trimethoxyallylsilane, trimethoxyisopropenylsilane, trimethoxy-3-butenylsilane, trimethoxy-4-pentenylsilane, trimethoxy-5-hexenylsilane, trimethoxy-6-heptenylsilane, trimethoxy-7-octenylsilane, trimethoxy-8-nonenylsilane, trimethoxy-9-decenylsilane, triethoxyvinylsilane, triethoxyallylsilane, triethoxyisopropenylsilane, triethoxy-3-butenylsilane, triethoxy-4-pentenylsilane, triethoxy-5-hexenylsilane, triethoxy-6-heptenylsilane, triethoxy-7-octenylsilane, triethoxy-8-nonenylsilane, triethoxy-9-decenylsilane, dimethoxymethylvinylsilane, dimethoxyethylvinylsilane, dimethoxypropylvinylsilane, dimethoxyisopropylvinylsilane, methoxydimethylvinylsilane and methoxydiethylvinylsilane. For improving the heat resistance and adhesiveness, preferable are trimethoxyvinylsilane, triethoxyvinylsilane, trimethoxyallylsilane and dimethoxymethylvinylsilane, more preferable are trimethoxyvinylsilane and triethoxyvinylsilane, and most preferable is trimethoxyvinylsilane. As for the alkoxysilane compound represented by the general formula (6), a type thereof may be used singly or 2 types or more thereof may be also used.

The hydrosilylation reaction between the cyclic siloxane compound represented by the general formula (3) and the aromatic carboxylic acid compound represented by the general formula (4), the phenolic compound represented by the general formula (5) or the alkoxysilane compound represented by the general formula (6) is carried out preferably using a catalyst. Examples of a hydrosilylation catalyst include a platinum catalyst, a palladium catalyst and a rhodium catalyst.

Examples of the platinum catalyst include chloroplatinic acid, a complex of chloroplatinic acid with an alcohol, an aldehyde, a ketone or the like, a platinum-olefin complex, a platinum-carbonylvinylmethyl complex (Ossko catalyst), a platinum-divinyltetramethyldisiloxane complex (KaRstedt catalyst), a platinum-cyclovinylmethylsiloxane complex, a platinum-octylaldehyde complex, a platinum-phosphine complex (such as $Pt[P(C_6H_5)_3]_4$, $PtCl[P(C_6H_5)_3]_3$ and $Pt[P(C_4H_9)_3]_4]$), a platinum-phosphite complex (such as $Pt[P(OC_6H_5)_3]_4]$ and $Pt[P(OC_4H_9)_3]_4$), and dicarbonyldichloroplatinum. Examples of the palladium catalyst or the rhodium catalyst include those compounds in which the platinum atom of the above platinum catalyst is replaced with a palladium atom or a rhodium atom. A type thereof may be used singly or 2 types or more thereof may be also used in combination. As a hydrosilylation catalyst, from the standpoint of the reactivity, preferable is a platinum catalyst, more preferable are a platinum-divinyltetramethyldisiloxane complex and a platinum-carbonylvinylmethyl complex, and most preferable is a platinum-carbonylvinylmethyl complex. The amount of the catalyst to be used is, from the standpoint of the reactivity, preferably 5% by mass or less of the total amount of the respective source materials, more preferably 0.0001 to 1.0% by mass, and most preferably 0.001 to 0.1% by mass. Although there is no particular restriction on the reaction conditions for hydrosilylation and conventional conditions can be applied using the catalyst, it is preferable to perform the reaction at a temperature between room temperature (25° C.) and 130° C. from the standpoint of the reaction speed. In the reaction, a conventionally known solvent, such as toluene, hexane, methyl isobutyl ketone, cyclopentanone and propylene glycol monomethyl ether acetate, may be used.

Although there is no particular restriction on the arylalkoxysilane compound represented by the general formula (2) insofar as it is represented by the general formula (2), as the $C_1$ to $C_6$ alkyl group or cycloalkyl group for $R^{11}$ in the general formula (2), $C_1$ to $C_6$ alkyl groups and cycloalkyl groups out of the groups exemplified for $R^1$, $R^4$ and $R^7$ can be exemplified, and thereamong, from the viewpoint of the high reactivity, preferable are a methyl group, an ethyl group, a propyl group, an isopropyl group, a butyl group, an isobutyl group and a t-butyl group, more preferable are a methyl group, an ethyl group and an isopropyl group, and most preferable is a methyl group. As $R^{12}$, $C_1$ to $C_3$ alkyl groups out of the groups exemplified for $R^1$, $R^4$ and $R^7$ can be exemplified, and a methyl group is preferable in view of better heat resistance. As $R^{13}$, $C_1$ to $C_4$ alkyl groups out of the groups exemplified for $R^1$, $R^4$ and $R^7$ can be exemplified, and a methyl group and an ethyl group are preferable in view of better heat resistance. In view of better heat resistance and adhesiveness, r is preferably a number of 2 to 3, and more preferably a number of 3. While, u is 0 or 1 to 5, and in view of better heat resistance, preferably a number of 0 or 1, and most preferably a number of 0 or 1.

Examples of the arylalkoxysilane compound represented by the general formula (2) include phenyltrimethoxysilane, phenyltriethoxysilane, toluoyltrimethoxysilane, xylyltrimethoxysilane, cumenyltrimethoxysilane, t-butylphenyltriethoxysilane, phenylmethyldimethoxysilane, phenylmethyldiethoxysilane, toluoylmethyldimethoxysilane, xylylmethyldimethoxysilane, cumenylmethyldimethoxysilane, phenylethyldimethoxysilane, phenylpropyldimethoxysilane, phenylbutyldimethoxysilane, phenylhexyldimethoxysilane, phenylcyclohexyldimethoxysilane and phenyldimethylmethoxysilane, and in view of better heat resistance and adhesiveness, preferable are phenyltrimethoxysilane, phenyltriethoxysilane, phenylmethyldimethoxysilane and phenylmethyldiethoxysilane, more preferable are phenyltrimethoxysilane and phenyltriethoxysilane, and most preferable is phenyltrimethoxysilane.

For the reaction between the cyclic siloxane compound represented by the general formula (1) and the arylalkoxysilane compound represented by the general formula (2) to yield a curable silicone resin having a silanol group as the component (A) according to the present invention, a hydrolysis-condensation reaction of an alkoxysilyl group, a so called sol-gel reaction, is conducted, and a hydrolysis-condensation reaction in a solvent with a catalyst such as acid, base or the like can be exemplified. There is no particular restriction on a solvent therefor, and specific examples include water, methanol, ethanol, n-propanol, isopropanol, n-butanol, isobutanol, acetone, methyl ethyl ketone, dioxane and tetrahydrofuran. A type thereof may be used singly, or 2 types or more thereof may be also used in combination. The hydrolysis-condensation reaction of an alkoxysilyl group proceeds by hydrolyzing the alkoxysilyl group with water to generate a silanol group (Si—OH group), and the reaction further proceeds by condensation between the generated silanol groups or between the silanol group and an alkoxysilyl group. To accelerate the hydrolysis reaction of an alkoxysilyl group, a proper amount of water is preferably added, or a catalyst dissolved in water may be added. The hydrolysis reaction can proceed by moisture in air or a trace of water contained in a solvent other than water.

As the catalyst such as acid, base or the like used for the hydrolysis-condensation reaction, any catalyst that can promote the hydrolysis-condensation reaction can be used, and specific examples thereof include inorganic acids, such as hydrochloric acid, phosphoric acid and sulfuric acid; organic acids, such as formic acid, acetic acid, oxalic acid, citric acid, methanesulfonic acid, benzenesulfonic acid, p-toluenesulfonic acid and monoisopropyl phosphate; inorganic bases, such as sodium hydroxide, potassium hydroxide, lithium hydroxide and ammonia; and amine compounds (organic bases), such as trimethylamine, triethylamine, monoethanolamine and diethanolamine. A type thereof may be used singly, or 2 types or more thereof may be also used in combination. The temperature for the hydrolysis-condensation reaction depends on the solvent type, the type and amount of the catalyst and the like, and is preferably 0 to 80° C., more preferably 5 to 50° C., and most preferably 8 to 30° C.

Not all the silanol groups generated by the hydrolysis of an alkoxysilyl group participate in the condensation reaction, and a part thereof remains unreacted in a reaction solution. Consequently, it is preferable not to isolate the (A) curable silicone resin having a silanol group from the reaction solution after the hydrolysis-condensation reaction, and rather to use a solution containing the component (A) according to the present invention after conducting, as needed, a catalyst removal treatment, solvent substitution, solution concentration and/or the like in order to prevent the content of the silanol group in the (A) curable silicone resin having a silanol group from being decreased by a condensation reaction between the silanol groups caused by the isolation. The content of the silanol group in the (A) curable silicone resin having a silanol group is preferably 1 to 30% by mass as OH content in view of higher adhesiveness, more preferably 3 to 25% by mass, and most preferably 5 to 20% by mass. Examples of a quantification method for a silanol group include a quantification method based on a mass increase after trimethylsilylation of the silanol group by trimethylchlorosilane or the like (TMS method), and an instrumental quantitative analysis, such as by a near-infrared spectrophotometer (see Japanese Unexamined Patent Application Publication No. 2001-208683 and Japanese Unexamined Patent Application Publication No. 2003-35667) and $^{29}$Si-NMR (see Japanese Unexamined Patent Application Publication No. 2007-217249).

In cases where the molecular weight of the (A) curable silicone resin having a silanol group in the positive photosensitive composition according to the present invention is too low, the film formation property when a permanent resist is formed with the positive photosensitive composition may be inadequate, while in cases where it is too high, the dissolving or dispersing property in an alkali developer is deteriorated, and resist residues on a substrate surface after the alkali development may increase. Further, from the standpoint of industrial applicability, such as handling property and efficiency, in cases where the molecular weight of the component (A) in the positive photosensitive composition according to the present invention is too low, the film formation property when a permanent resist is formed with the positive photosensitive composition may be inadequate, while in cases where it is too high, the dissolving or dispersing property in an alkali developer is deteriorated, and resist residues may remain on a substrate surface after the alkali development. Consequently, the mass average molecular weight is preferably 600 to 50,000, more preferably 800 to 20,000, and most preferably 1,000 to 10,000, wherein the mass average molecular weight means herein a mass average molecular weight reduced to polystyrene by means of GPC analysis using tetrahydrofuran (hereinafter referred to as "THF") as a solvent.

Since the (A) curable silicone resin having a silanol group to be used in the present invention is such a curable silicone resin having a silanol group which can be obtained by a reaction between the cyclic siloxane compound represented by the general formula (1) and the arylalkoxysilane compound represented by the general formula (2), for production of the (A) curable silicone resin having a silanol group to be used in the present invention, the cyclic siloxane compound represented by the general formula (1) does not always have to be used. A compound, whose carboxyl group or phenolic group is protected with a t-butyl group, as represented, for example, by the following general formula (1a):

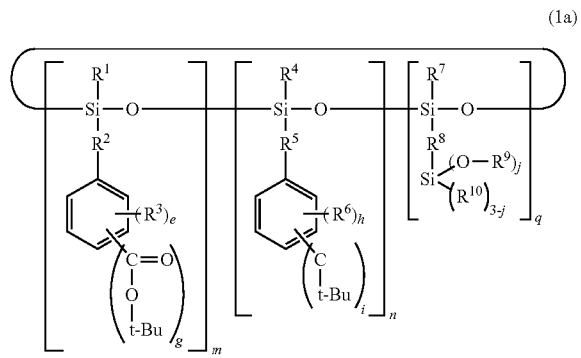

(1a)

(wherein $R^1$ to $R^{10}$, e, g, h, i, j, m, n and q are the same meanings as defined for the general formula (1)) may be reacted with the arylalkoxysilane compound represented by the general formula (2) to yield an intermediate product to a curable silicone resin. After removing the protecting t-butyl group therefrom, the (A) curable silicone resin having a silanol group can be obtained.

In this case, for preparing the compound represented by the general formula (1a), in place of the compound used as the source material for preparing the compound represented by the general formula (1), a compound whose carboxyl group or phenolic group is protected with a t-butyl group can be used. Namely, instead of the aromatic carboxylic acid compound represented by the general formula (4), an aromatic carboxylic acid t-butyl ester compound represented by the following general formula (4a) is used:

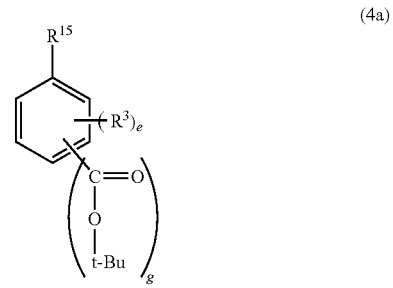

(4a)

(wherein $R^{15}$, $R^3$, e and g are the same meanings as defined for the general formula (4)), and instead of the phenolic compound represented by the general formula (5), a phenol t-butyl ether compound represented by the following general formula (5a) is used:

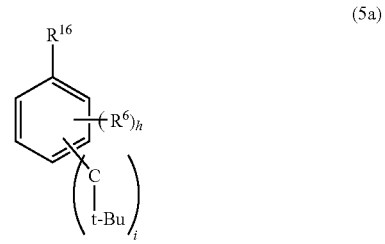

(5a)

(wherein $R^{16}$, $R^6$, h and i are the same meanings as defined for the general formula (5)) to perform a similar reaction with the compound represented by the general formula (1) to obtain the compound represented by the general formula (1a).

Such protected compound can be subjected to a hydrolysis-condensation reaction in the same manner as for an unprotected compound. In cases where the protecting group is a t-butyl group, after the hydrolysis-condensation reaction, the t-butyl group can be removed in a solvent with a catalyst as needed. It is preferred that a boron trifluoride diethyl ether complex be used as the catalyst.

As the solvent, an organic solvent that can dissolve water at 1% by mass or more at 25° C. is used preferably. Examples of the organic solvent include alcohols, such as methanol, ethanol, propanol and isopropanol; ether alcohols, such as 1-methoxy-ethanol, 1-ethoxy-ethanol, 1-propoxy-ethanol, 1-isopropoxy-ethanol, 1-butoxy-ethanol, 1-methoxy-2-propanol, 3-methoxy-1-butanol and 3-methoxy-3-methyl-1-butanol; acetic acid esters of ether alcohols, such as 1-methoxy-ethyl acetate, 1-ethoxy-ethyl acetate, 1-methoxy-2-propyl acetate, 3-methoxy-1-butyl acetate and 3-methoxy-3-methyl-1-butyl acetate; ketones, such as acetone and methyl ethyl ketone; keto-alcohols, such as 4-hydroxy-2-butanone, 3-hydroxy-3-methyl-2-butanone and 4-hydroxy-2-methyl-2-pentanone (diacetone alcohol); and ethers, such as 1,4-dioxane, tetrahydrofuran and 1,2-dimethoxyethane. Thereamong, preferable are methanol, ethanol, propanol, methyl ethyl ketone, 1,4-dioxane and tetrahydrofuran.

In cases where the protected compound is used, a step of removing the protecting group is required and a production process becomes more complex; however, it gains advantages that side effects are suppressed, and that the heat resistance and the chemical resistance of the permanent resist according to the present invention are improved. Meanwhile, a compound represented by the general formula (1a) can be converted to the compound represented by the general formula (1) by removing the t-butyl group.

Although there is no particular restriction on (B) diazonaphthoquinones which can be used in the present invention insofar as it belongs to diazonaphthoquinone compounds known to be usable as a photosensitive material, thereamong preferable is a compound (4-diazonaphthoquinone sulfonic acid ester) prepared by substituting a hydrogen atom in a compound having a phenolic hydroxide group with the group represented by the following formula (7):

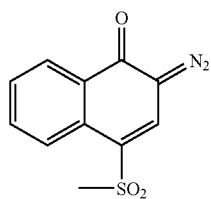

(7)

or a compound (5-diazonaphthoquinone sulfonic acid ester) prepared by substituting a hydrogen atom in a compound having a phenolic hydroxide group with the group represented by the following formula (8):

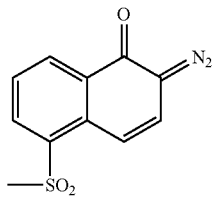

(8)

Specific preferable examples of such diazonaphthoquinones include compounds represented by the following formulas (9) to (14) and regioisomers thereof.

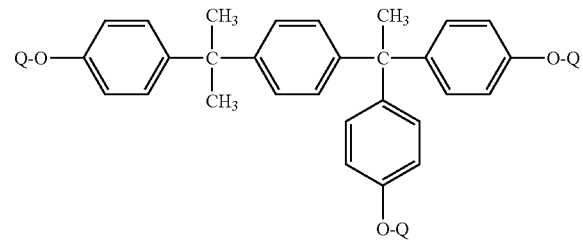

(9)

(wherein Qs are a group represented by the formula (7) or (8), or a hydrogen atom, provided that all of the Qs are not simultaneously hydrogen atoms.)

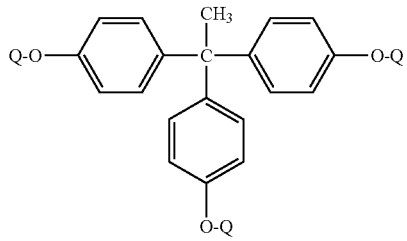

(10)

(wherein Qs are a group represented by the formula (7) or (8), or a hydrogen atom, provided that all of the Qs are not simultaneously hydrogen atoms.)

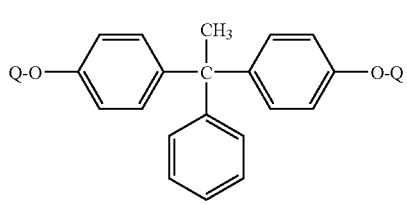

(11)

(wherein Qs are a group represented by the formula (7) or (8), or a hydrogen atom, provided that all of the Qs are not simultaneously hydrogen atoms.)

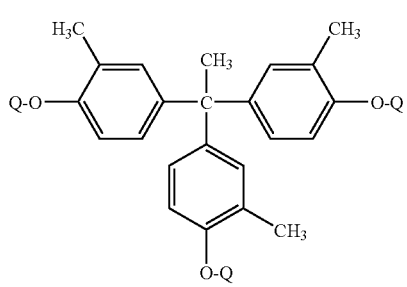

(12)

(wherein Qs are a group represented by the formula (7) or (8), or a hydrogen atom, provided that all of the Qs are not simultaneously hydrogen atoms.)

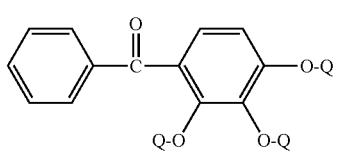

(13)

(wherein Qs are a group represented by the formula (7) or (8), or a hydrogen atom, provided that all of the Qs are not simultaneously hydrogen atoms.)

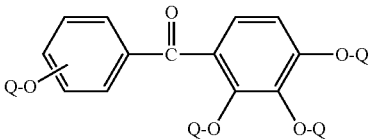

(14)

(wherein Qs are a group represented by the formula (7) or (8), or a hydrogen atom, provided that all of the Qs are not simultaneously hydrogen atoms.)

The group represented by the formula (7) has an absorption band in the i line (wavelength of 365 nm) region, therefore is suitable for exposure to the i line, and the group represented by the formula (8) has an absorption band over a broad wavelength region, therefore suitable for exposure to a broad wavelength of light. Namely, it is preferable to choose either of the group represented by the formula (7) or the group represented by the formula (8) according to the wavelength of light for exposure.

In the present invention, the content of (B) diazonaphthoquinones with respect to 100 parts by mass of the (A) curable silicone resin having a silanol group is 0.1 to 10 parts by mass, and preferably 1 to 5 parts by mass in view of the development performance and the microfabrication property of the permanent resist according to the present invention.

Although there is no particular restriction on the (C) solvent which can be used in the present invention and any organic solvent that can dissolve or disperse the (A) curable silicone resin having a silanol group and (B) diazonaphthoquinones can be used, an organic solvent that can dissolve water at 1% by mass or more at 25° C. is preferable. Examples of such organic solvent include, in addition to the organic solvents exemplified for removing the protecting t-butyl group, γ-butyrolactone, γ-valerolactone, δ-valerolactone, ethylene carbonate, propylene carbonate and dimethyl carbonate.

The content of the (C) solvent with respect to 100 parts by mass of the (A) curable silicone resin having a silanol group is preferably 10 to 10,000 parts by mass, more preferably 100 to 1,000 parts by mass in view of the formability in forming a permanent resist with the positive photosensitive composition according to the present invention, and the physical properties of the prepared permanent resist.

The positive photosensitive composition according to the present invention, which contains the (A) curable silicone resin having a silanol group, (B) diazonaphthoquinones, and the (C) solvent, may be treated, as needed, by a filter with a pore size of, for example, about 0.2 μm, and subjected to use.

Further, the positive photosensitive composition according to the present invention may also contain as needed a crosslinker, a plasticizer, a thixotropic agent, a photo-acid generator, a thermal acid generator, a dispersing agent, an antifoaming agent, a pigment, a dye and the like.

The positive permanent resist according to the present invention is prepared by coating the positive photosensitive composition according to the present invention onto an object material, which may be conducted by using the positive photosensitive composition according to the present invention similarly as a positive photosensitive composition used in a conventionally known production process for a positive permanent resist. However, the process for producing the positive permanent resist according to the present invention described below can be preferably used to obtain the same.

The process for producing the positive permanent resist according to the present invention should have the following steps. Namely, it has the steps of coating the positive photosensitive composition according to the present invention onto an object material (the first step); subjecting the object material to a temperature between 60 and 120° C. for 30 sec to 10 min (the second step); irradiating the object material with patterned light to increase the alkali-solubility of the irradiated part (the third step); patterning by treating the irradiated object material with an alkali solution (the fourth step); irradiating the entire object material to enhance the visible light transmission (the fifth step); and subjecting the object material to a temperature between 120 and 350° C. for 30 min to 2 hours (the sixth step).

With respect to the object material on which the positive photosensitive composition according to the present invention is coated at the first step, there is no particular restriction insofar as it is a material having chemical resistance to a treatment with an alkali solution at the fourth step, a solvent in the positive photosensitive composition and the like, and heat resistance to a treatment at the sixth step. A glass, a metal, a semiconductor and the like can be selected as the object material, and especially a surface of TFT of a liquid crystal display requiring a positive permanent resist as an insulation layer can be exemplified as a preferable material.

There is no particular restriction on the method for coating a positive photosensitive composition onto the object material at the first step, and a conventionally used method or a previously known method can be applied. Examples of such method include a spin coating method, a dip coating method, a knife coating method, a roll coating method, a spray coating method and a slit coating method, and a spin coating method and a slit coating method are preferable.

A positive photosensitive composition is preferably coated onto the object material so as to form a layer of the composition. The thickness of such layer of the positive photosensitive composition depends on an end use without particular restriction, and is 0.1 μm to 100 μm, preferably 3 μm to 10 μm.

At the second step, the object material coated with a positive photosensitive composition is heat-treated at a temperature of 60 to 120° C. for 30 sec to 10 min, and preferably at a temperature of 100 to 120° C. for 1 to 5 min. At this step, the layer of the positive photosensitive composition is made insoluble to an alkali solution as the (C) solvent evaporates. The second step may be carried out after the positive photosensitive composition according to the present invention is coated onto an object material as it is; however, it is preferably carried out after it is treated at a temperature from room temperature to not more than 60° C. under a normal pressure or a reduced pressure such that an organic solvent in the layer of the positive photosensitive composition is evaporated and the content of the organic solvent therein is lowered to 5% by mass or less.

At the third step, the layer of the positive photosensitive composition made insoluble to an alkali solution at the second step is irradiated with patterned light to increase the alkali-solubility of the irradiated part. There is no particular restriction on the irradiating light insofar as it has an amount of energy for increasing the alkali-solubility of the irradiated part of the layer of the positive photosensitive composition that has been made insoluble to an alkali solution at the second step, and the amount of energy is, for example, 10 to 1,000 mJ/cm$^2$, and preferably 40 to 300 mJ/cm$^2$. Further, the wavelength of the irradiating light may be in the range of visible light or UV light without particular restriction. In cases where 4-diazonaphthoquinone sulfonic acid esters are used as the (B) diazonaphthoquinones, narrow wavelength of light mainly consisting of the i-line (365 nm) is irradiated, and in cases where 5-diazonaphthoquinone sulfonic acid esters are used, broad wavelength of light containing the i-line (365 nm), h-line (405 nm) and g-line (436 nm) is irradiated using a high pressure mercury lamp, a super high pressure mercury lamp, or the like.

There is no particular restriction on a patterning method of the irradiating light, and a conventional method, such as photoirradiation through a photomask, or selective irradiation by laser, may be used.

At the fourth step, the part of the layer of the positive photosensitive composition, which alkali solubility has been increased at the third step, is treated with an alkali solution, namely is contacted with an alkali solution, to dissolve the part with an increased solubility in the alkali solution and to remove the part from the layer of the positive photosensitive composition.

There is no particular restriction on the alkali solution to be used at the fourth step, and an aqueous solution of alkali can be used. Examples thereof include an aqueous solution of inorganic alkalis, such as sodium hydroxide, potassium hydroxide, sodium carbonate, potassium carbonate, sodium silicate and ammonia selected from potassium hydroxide, sodium hydroxide, potassium carbonate, sodium carbonate and the like; primary amines, such as ethylamine and n-propylamine; secondary amines, such as diethylamine and di-n-propylamine; tertiary amines, such as trimethylamine, methyldiethylamine, dimethylethylamine and triethylamine; tertiary alkanol amines, such as dimethylethanolamine, methyldiethanolamine and triethanolamine; cyclic tertiary amines, such as pyrrole, piperidine, N-methylpiperidine, N-methylpyrrolidine, 1,8-diazabicyclo[5.4.0]-7-undecene and 1,5-diazabicyclo[4.3.0]-5-nonene; aromatic tertiary amines, such as pyridine, collidine, lutidine and quinoline; and quarternary ammonium salts, such as tetramethylammonium hydroxide and tetraethylammonium hydroxide. The concentration thereof may be identical with the alkali concentration of a developer for removing the layer of the conventional positive photosensitive composition. These aqueous alkali solutions may contain additionally an appropriate amount of a water-soluble organic solvent, such as methanol or ethanol, and/or a surfactant.

For the method of contacting an alkali solution, any of, for example, a puddle development method, a dipping method, a showering method, a spraying method and the like may be applied. The contact duration depends on the molecular weight of the (A) curable silicone resin having a silanol group, the temperature of a developer and the like, and is normally 30 to 180 sec. After the removal of the part which alkali solubility has been increased by an alkali solution, the object material is preferably rinsed by running water or showering water, and then may be dried as needed in the range of 50 to 120° C.

At the fifth step, the remaining layer of the positive photosensitive composition after the treatment with an alkali solution at the fourth step (the layer of the positive photosensitive composition remained after the treatment with an alkali solution is hereinafter occasionally referred to as a "resist layer") is irradiated entirely to enhance the visible light transmission. That is, the resist layer remained after the fourth step is often colored light yellow to light brown. The purpose of the fifth step is therefore to irradiate the entire remaining resist layer for enhancing the visible light transmission.

There is no particular restriction on the irradiating light at the fifth step, and, for example, light of 10 to 1,000 mJ/cm$^2$, preferably 40 to 600 mJ/cm$^2$ is radiated. Further, the wavelength of the irradiating light is without particular restriction and is preferably selected in accordance with the used (B) diazonaphthoquinones as at the third step.

At the sixth step, the resist layer after the fifth step is heat-treated at a temperature between 120 and 350° C. for 30 min to 2 hours. The resist layer after the fifth step has an enhanced visible light transmission as described above, and its alkali solubility is increased once again in the sixth step. Consequently, by applying a temperature of 120 to 350° C. for 30 min to 2 hours, or preferably 200 to 270° C. for 45 min to 90 min to the resist layer, the silicone resins in the resist layer are thermally crosslinked to impart the heat resistance, chemical resistance and anti-aging property required for a permanent resist. The sixth step is preferably carried out under an inert gas atmosphere, such as a nitrogen atmosphere or an argon atmosphere, or under a reduced pressure atmosphere.

Since the positive permanent resist according to the present invention is superior in transparency, insulation property, heat resistance and chemical resistance, it is very useful as an interlayer insulation film for an active matrix substrate to be used for a liquid crystal display device, an organic EL display device and the like, and especially as an interlayer insulation film for an active matrix substrate having a TFT with an active layer of a polysilicon thin film. Further, it can be used as an interlayer insulation film for a semiconductor element. Furthermore, it can be used as a wafer coating material of a semiconductor element, such as a protective top coat, a bump protection film, an MCM (multi-chip module) interlayer protective film or a junction coat, and a package material, such as a sealing material or a die bonding material.

The positive permanent resist according to the present invention is also useful as an insulation film for a semiconductor element, a multilayer circuit board and the like. Examples of the semiconductor element include discrete semiconductor elements, such as a diode, a transistor, a compound semiconductor, a thermistor, a varistor and a thyristor; memory elements, such as a DRAM (dynamic random access memory), a SRAM (static random access memory), an EPROM (erasable programmable read-only memory), a mask ROM (mask read-only memory), an EEPROM (electrically erasable programmable read-only memory) and a flash memory; logical circuits, such as a microprocessor, a DSP and an ASIC; integrated circuit elements such as a compound semiconductor represented by an MMIC (monolithic microwave integrated circuit); and photoelectric conversion elements, such as a hybrid integrated circuit (hybrid IC), a light emitting diode and a charge-coupled device. Examples of the multilayer circuit board include a high density circuit board such as an MCM.

EXAMPLES

The present invention will be described in more detail by way of examples thereof, provided that the present invention is not construed to be limited thereto.

In the Examples and the Comparative Examples, the content of the silanol group was determined by: allowing a sample to react with trimethylchlorosilane in a pyridine solution to convert the silanol group to a trimethylsilyl ether group, hydrolyzing a C—O—Si bond by a treatment with tetramethylammonium hydroxide (($CH_3$)$_4$NOH) aqueous solution, and calculating backward from the mass increase rate after the reactions. Here, the (A) curable silicone resin having a silanol group may be also called a component (A), the (B) diazonaphthoquinones a component (B), and the (C) solvent a component (C).

[Production of (A) Curable Silicone Resin (a)]

Added to 300 parts by mass of toluene were 100 parts by mass of 2,4,6,8-tetramethylcyclotetrasiloxane, 85 parts by mass of 4-vinylbenzoic acid-t-butyl ester, 110 parts by mass of para-t-butoxystyrene, 93 parts by mass of trimethoxyvinylsilane and 0.0001 part by mass of platinum-divinyltetramethyldisiloxane complex (Karstedt catalyst), and the mixture was allowed to react at 60° C. for 15 hours with stirring. The solvent was removed from the reaction solution by distillation at 60° C. under a reduced pressure to obtain a cyclic siloxane compound (1) corresponding to the formula (1a).

Referring to the general formula (1a), the cyclic siloxane compound (1) has a methyl group for each $R^1$, $R^4$, $R^7$ and $R^9$, an ethylene group for each $R^2$, $R^5$ and $R^8$, while e=0, g=1, h=0, i=1 and j=3, namely e=0, h=0 and 3−j=0, and therefore is a compound in which $R^3$, $R^6$ and $R^{10}$ do not exist. The ratio of m, n and q is determined by the molar ratio of the initial quantities of 4-vinylbenzoic acid-t-butyl ester, para-t-butoxystyrene and trimethoxyvinylsilane at m:n:q=1:1.5:1.5, while m+n+q=4 as 2,4,6,8-tetramethylcyclotetrasiloxane was used. According to an analysis by $^1$H-NMR, there was no peak signal attributable to a hydrogen atom of an Si—H group recognized in a chemical shift region of 4.3 to 5.0 ppm in the cyclic siloxane compound (1). According to an analysis by GPC of the cyclic siloxane compound (1), the mass average molecular weight was 900 (Calcd: 933) and a relative peak area originated from unreacted 4-vinylbenzoic acid-t-butyl ester was found to have decreased to 0.5% or less.

Then, added to 100 parts by mass of the cyclic siloxane compound (1) were 40 parts by mass of phenyltrimethoxysilane and 200 parts by mass of toluene, and while stirring the mixture on ice at 10° C., 50 parts by mass of a 5% oxalic acid aqueous solution was dropped over 30 min. The reactant system was kept at 10° C. and stirred for 15 hours, then was treated at reflux for removal of water and alcohol at 50° C. under a reduced pressure. Then, solvent exchange from toluene to 1-methoxy-2-propanol acetate (hereinafter referred to as "PGMEA") was conducted at 50° C. under a reduced pressure to obtain a 25% PGMEA solution of the intermediate product (1).

In order to remove the t-butyl group, 400 parts by mass of the 25% PGMEA solution of the intermediate product (1) and 3 parts by mass of boron trifluoride-diethyl ether complex were mixed with stirring at 80° C. for 3 hours, and then treated for removing 100 parts by mass of the solvent under a reduced pressure. Then, added to the mixture was 10 parts by mass of an absorbent of an acidic material (Trade name: Kyowado 500SH, manufactured by Kyowa Chemical Industry Co., Ltd.) and the mixture was stirred at 80° C. for 1 hour. The resulted slurry was filtered to remove solid materials, and then concentrated under a reduced pressure to obtain a 30% PGMEA solution of the curable silicone resin (a) according to the present invention. The mass average molecular weight of the curable silicone resin (a) according to a GPC analysis was 6,400 and the silanol group content was 5.4% by mass.

[Production of (A) Curable Silicone Resin (b)]

Added to 300 parts by mass of toluene were 100 parts by mass of 2,4,6,8-tetramethylcyclotetrasiloxane, 170 parts by mass of 4-vinylbenzoic acid-t-butyl ester, 36.7 parts by mass of mass of para-t-butoxystyrene, 93 parts by trimethoxyvinylsilane and 0.0001 part by mass of platinum-divinyltetramethyldisiloxane complex (Karstedt catalyst), and the mixture was allowed to react at 60° C. for 15 hours with stirring. The solvent was removed from the reaction solution by distillation at 60° C. under a reduced pressure to obtain a cyclic siloxane compound (2) corresponding to the formula (1a).

Referring to the formula (1a), the cyclic siloxane compound (2) has a methyl group for each $R^1$, $R^4$, $R^7$ and $R^9$, an ethylene group for each $R^2$, $R^5$ and $R^8$, while e=0, g=1, h=0, i=1 and j=3, namely e=0, h=0 and 3−j=0, and therefore is a compound in which $R^3$, $R^6$ and $R^{10}$ do not exist. The ratio of m, n and q is determined by the molar ratio of the initial quantities of 4-vinylbenzoic acid-t-butyl ester, para-t-butoxystyrene and trimethoxyvinylsilane at m:n:q=1:0.25:0.75, while m+n+q=4 as 2,4,6,8-tetramethylcyclotetrasiloxane was used. According to an analysis by $^1$H-NMR, there was no peak signal attributable to a hydrogen atom of an Si—H group recognized in a chemical shift region of 4.3 to 5.0 ppm in the cyclic siloxane compound (2). According to an analysis by GPC of the cyclic siloxane compound (2), the mass average molecular weight was 960 (Calcd: 959) and a relative peak area originated from unreacted 4-vinylbenzoic acid-t-butyl ester was found to have decreased to 0.5% or less.

Thereafter, a similar procedure was conducted as for the curable silicone resin (a) to obtain a 30% PGMEA solution of the curable silicone resin (b) according to the present invention. The mass average molecular weight of the curable silicone resin (b) according to a GPC analysis was 7,800, and the silanol group content was 5.1% by mass.

[Production of (A) Curable Silicone Resin (c)]

Added to 100 parts by mass of the cyclic siloxane compound (2) were 8 parts by mass of phenyltrimethoxysilane and 200 parts by mass of toluene, and while stirring the mixture on ice at 10° C., 50 parts by mass of a 5% oxalic acid aqueous solution was dropped over 30 min. The reactant system was kept at 10° C. and stirred for 15 hours and then was treated at reflux for removal of water and alcohol at 50° C. under a reduced pressure. Then, solvent exchange from toluene to PGMEA was conducted at 50° C. under a reduced pressure to obtain a 25% PGMEA solution of the intermediate product (2).

Thereafter, in order to remove the t-butyl group, a similar procedure was conducted as for the curable silicone resin (a) to obtain a 30% PGMEA solution of the curable silicone resin (c) according to the present invention. The mass average molecular weight of the curable silicone resin (c) according to a GPC analysis was 9,500, and the silanol group content was 4.2% by mass.

[Production of (A) Comparative Silicone Resin (d)]

Added to 100 parts by mass of the cyclic siloxane compound (2) was 200 parts by mass of toluene, and while stirring the mixture on ice at 10° C., 50 parts by mass of a 5% oxalic acid aqueous solution was dropped over 30 min. The reactant system was kept at 10° C. and stirred for 15 hours, then was treated at reflux for removal of water and alcohol at 50° C. under a reduced pressure, and then toluene was removed at 50° C. under a reduced pressure.

Thereafter, in order to remove the t-butyl group, a similar procedure was conducted as for the curable silicone resin (a) to obtain a 30% PGMEA solution of the comparative silicone resin (d). The silicone resin (d) is an example of a curable silicone resin which is not allowed to react with an arylalkoxysilane compound represented by the general formula (2). The mass average molecular weight of the silicone resin (d) according to a GPC analysis was 11,000, the mass average molecular weight of the curable silicone resin (d) according to a GPC analysis was 9,500, and the silanol group content was 1.4% by mass.

[Production of (A) Comparative Silicone Resin (e)]

A procedure identical with that for producing the (A) silicone resin (a) was conducted, except that 184 parts by mass of 4-t-butoxystyrene was used instead of 85 parts by mass of 4-vinylbenzoic acid-t-butyl ester and 110 parts by mass of para-t-butoxystyrene, to obtain a 30% PGMEA solution of a comparative silicone resin (e). The silicone resin (e) is an example using a cyclic siloxane compound (1) whose m is 0 in the general formula (1). The mass average molecular weight of the silicone resin (e) according to a GPC analysis was 11,000, the mass average molecular weight of the curable silicone resin (e) according to a GPC analysis was 6,700, and the silanol group content was 4.8% by mass.

[Production of Comparative Silicone Resin (f)]

According to Synthesis Example 1 in Examples of Japanese Unexamined Patent Application Publication No. 2008-116785, to 157 parts by mass of diacetone alcohol (hereinafter referred to as "DAA"), 100 parts by mass of methyltrimethoxysilane and 78 parts by mass of phenyltrimethoxysilane were added and while mixing with stirring at room temperature, 61 parts by mass of 0.3% phosphoric acid aqueous solution was dropped over 10 min. The mixture was then stirred at 40° C. for 30 min, heated to 105° C. over 30 min and then stirred at 105° C. for 2 hours to obtain a DAA solution of a silicone resin (f). The solid content of the DAA solution of the silicone resin (f) was 39% by mass, the water content was 1.8% by weight, and the mass average molecular weight of the silicone resin (f) was 6,000.

[(B) Diazonaphthoquinones]

As the component (B), a compound represented by the formula (9) whose Qs are entirely a group represented by the formula (8) (Trade name: PA-6, manufactured by Daito Chemix Corporation, hereinafter referred to as "DNQ") was used.

[(C) Solvent]

As the component (C), any one of the followings was used.
1-methoxy-2-propanol acetate (PGMEA)
diacetone alcohol (DAA)
γ-butyrolactone (GBL)

The above-described component (A), component (B) and component (C) were mixed in accordance with the ratio (part by mass) set forth in Table 1, and the mixture was filtered to prepare the positive photosensitive compositions of Examples 1 to 4 and Comparative Examples 1 to 3. Expressions of (a) to (f) in Table 1 refer to the above-described silicone resins (a) to (f).

TABLE 1

| | Component (A) | Component (B) | Component (C) |
|---|---|---|---|
| Example 1 | (a)30 | DNQ, 0.8 | PGMEA, 70 |
| Example 2 | (b)30 | DNQ, 0.8 | PGMEA, 70 |
| Example 3 | (c)30 | DNQ, 0.8 | PGMEA, 70 |
| Example 4 | (d)30 | DNQ, 0.8 | PGMEA, 70 |
| Comparative Example 1 | (e)30 | DNQ, 0.8 | PGMEA, 70 |
| Comparative Example 2 | (f)30 | DNQ, 0.8 | PGMEA, 70 |
| Comparative Example 3 | (f)30 | DNQ, 0.8 | DAA, 58 GBL, 7 Water, 2 |

[Preparation of Test Piece]

Each of the positive photosensitive compositions of Examples 1 to 4 and Comparative Examples 1 to 3 was coated onto a 2.5 cm square glass substrate by a spin coater to the thickness of 5 μm after solvent evaporation and then the solvent was evaporated to obtain a test piece, which was heat-treated at 120° C. for 30 min. Placed on top of the heat-treated glass substrate was a photomask with a drawing of 5 μm-wide lines, and the substrate was irradiated with UV light of a high pressure mercury lamp at 100 mJ/cm². Next, the test piece was dipped in a 2.38% by mass tetramethylammonium hydroxide aqueous solution for 120 sec, then washed with water to remove alkali soluble parts and air-dried. Thereafter, the test piece was irradiated with a super high pressure mercury lamp at 100 mJ/cm² (based on exposure to wavelength of 365 nm), heat-treated at 230° C. for 1 hour under a nitrogen atmosphere to form a positive permanent resist, which was used as the test piece.

[Evaluation Tests]

The following tests were conducted with test pieces prepared using the respective positive photosensitive compositions of Examples 1 to 4 and Comparative Examples 1 to 3. The results are shown in Table 2. The transmittance in the present evaluation tests means transmittance of light with 400 nm-wavelength per 4 μm film-thickness.

[Resolution Test]

Each test piece was cut, and the section was observed by a scanning electron microscope to inspect whether or not the 5 μm line-and-space pattern was formed to 1:1 wide-stripes. The resolution was evaluated according to the following criteria:

○: Good resolution, pattern was formed to 1:1 wide-stripes
x: Poor resolution, pattern was not formed to 1:1 wide-stripes

[Transmittance Before Test]

The transmittance of 400 nm-wavelength light was measured for each test piece by an ultraviolet and visible spectrophotometer.

[Water Resistance Test]

Each test piece was immersed in ion exchanged water at 60° C. for 24 hours. The transmittance was measured for the test piece before and after the immersion, and the transmittance change rate (%) was determined as the change in transmittance after the immersion relative to the transmittance before the immersion. Further, the thickness was measured by a stylus surface profile determining apparatus for the test piece before and after the immersion, and the thickness change rate (%) was determined as the change in thickness after the immersion relative to the thickness before the immersion.

[Acid Resistance Test]

Each test piece was immersed in a 5% by mass of hydrochloric acid at room temperature for 5 hours. The transmittance was measured for the test piece before and after the immersion, and the transmittance change rate (%) was determined as the change in transmittance after the immersion relative to the transmittance before the immersion. Further, the thickness was measured by a stylus surface profile determining apparatus for the test piece before and after the immersion, and the thickness change rate (%) was determined as the change in thickness after the immersion relative to the thickness before the immersion.

[Solvent Resistance Test]

Each test piece was immersed in dimethylsulfoxide (DMSO) at room temperature for 5 hours. The transmittance was measured for the test piece before and after the immersion, and the transmittance change rate (%) was determined as the change in transmittance after the immersion relative to the transmittance before the immersion. Further, the thickness was measured by a stylus surface profile determining apparatus for the test piece before and after the immersion, and the thickness change rate (%) was determined as the change in thickness after the immersion relative to the thickness before the immersion.

[Heat Resistance Test]

Each test piece was heated at 230° C. under a nitrogen atmosphere for 5 hours. The transmittance was measured for the test piece before and after the heating, and the transmittance change rate (%) was determined as the change in transmittance after the heating relative to the transmittance before the heating. Further, the thickness was measured by a stylus surface profile determining apparatus for the test piece before and after the heating, and the thickness change rate (%) was determined as the change in thickness after the heating relative to the thickness before the heating.

[Light Resistance Test]

Each test piece was irradiated by light with irradiance of 2,000 mW/cm² at a distance of 5 mm at a temperature of 100° C. for 24 hours. The transmittance was measured for the test piece before and after the irradiation, and the transmittance change rate (%) was determined as the change in transmittance after the irradiation relative to the transmittance before the irradiation.

In the above-described tests, smaller values of the transmittance change rate (%) or the thickness change rate (%) mean better quality.

TABLE 2

|  |  | Example | | | | Comparative Example | | |
| --- | --- | --- | --- | --- | --- | --- | --- | --- |
|  |  | 1 | 2 | 3 | 4 | 1 | 2 | 3 |
| Resolution test | | ○ | ○ | ○ | ○ | x | ○ | ○ |
| Transmittance before test (%) | | 98.0 | 98.1 | 98.2 | 98.3 | 98.1 | 98.2 | 98.0 |
| Water resistance test | Transmittance change rate (%) | 0.0 | 0.0 | 0.0 | 0.0 | −0.2 | −0.1 | −0.3 |
|  | Thickness change rate (%) | 0.0 | 0.0 | 0.0 | 0.0 | 0.0 | 0.0 | 0.5 |
| Acid resistance test | Transmittance change rate (%) | 0.0 | 0.0 | 0.0 | 0.0 | 0.0 | 0.0 | 0.2 |
|  | Thickness change rate (%) | 0.0 | 0.0 | 0.0 | 0.0 | 0.0 | 0.0 | −0.3 |
| Solvent resistance test | Transmittance change rate (%) | −0.2 | 0.0 | −0.1 | −0.1 | −0.1 | −2.8 | −10.6 |
|  | Thickness change rate (%) | 3.1 | 1.8 | 2.9 | 3.0 | 2.2 | 4.9 | 8.3 |
| Heat resistance test | Transmittance change rate (%) | −1.3 | −0.8 | −1.6 | −1.1 | −1.3 | −2.8 | −5.6 |
|  | Thickness change rate (%) | −2.1 | −1.4 | −1.9 | −2.0 | −1.7 | −2.3 | −8.3 |
| Light resistance test | Transmittance change rate (%) | −6.3 | −3.3 | −4.6 | −5.6 | −4.2 | −11.6 | −41.3 |

The invention claimed is:

1. A positive photosensitive composition comprising:
   (A) a curable silicone resin having a silanol group, the resin being obtained by a reaction between a cyclic siloxane compound represented by the following general formula (1):

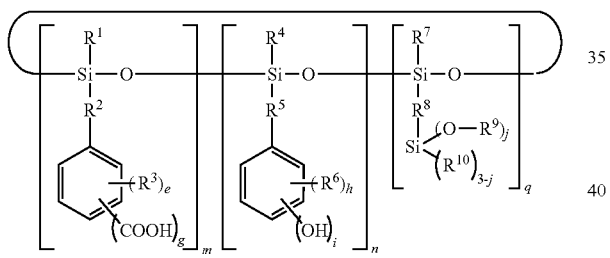

(1)

(wherein $R^1$, $R^4$ and $R^7$ are $C_1$ to $C_{10}$ alkyl groups, cycloalkyl groups or aryl groups that may be the same or differrent; $R^2$, $R^5$ and $R^8$ are $C_1$ to $C_{10}$ alkylene groups that may be the same or different and be substituted by a hydrocarbon group; $R^3$ and $R^6$ are $C_1$ to $C_4$ alkyl groups that may be the same or different; e is a number of 0 or 1 to 4 and g is a number of 1 to 3, provided that e+g does not exceed 5; h is a number of 0 or 1 to 4 and i is a number of 1 to 3, provided that h+i does not exceed 5; $R^9$ is a $C_1$ to $C_6$ alkyl group or cycloalkyl group that may be the same or different; $R^{10}$ is a $C_1$ to $C_3$ alkyl group; j is a number of 1 to 3; and m, n and q are numbers satisfying m:n:q=1:0 to 2:0.5 to 3 as well as m+n+q=3 to 6) and an arylalkoxysilane compound represented by the following general formula (2):

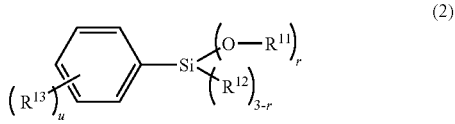

(2)

(wherein $R^{11}$ is a $C_1$ to $C_6$ alkyl group or cycloalkyl group that may be the same or different; $R^{12}$ is a $C_1$ to $C_3$ alkyl group; $R^{13}$ is a $C_1$ to $C_4$ alkyl group that may be the same or different; r is a number of 1 to 3; and u is a number of 0 or 1 to 5);
   (B) diazonaphthoquinones; and
   (C) a solvent.

2. A positive permanent resist being prepared by coating the positive photosensitive composition according to the claim 1 onto an object material.

3. A method for producing a positive permanent resist comprising the steps of:
   coating the positive photosensitive composition according to the claim 1 onto an object material;
   subjecting said object material to a temperature between 60 and 120° C. for 30 sec to 10 min;
   irradiating said heat-treated object material with patterned light to increase the alkali-solubility of the irradiated part;
   patterning by treating said irradiated object material with an alkali solution;
   irradiating the entire object material after said patterning to enhance the visible light transmission; and
   subjecting said object material irradiated entirely to a temperature between 120 and 350° C. for 30 min to 2 hours.

* * * * *